(12) United States Patent
Lu et al.

(10) Patent No.: US 11,955,371 B2
(45) Date of Patent: Apr. 9, 2024

(54) SEMICONDUCTOR DEVICE AND METHOD FOR PREPARING SEMICONDUCTOR DEVICE

(71) Applicant: CHANGXIN MEMORY TECHNOLOGIES, INC., Hefei (CN)

(72) Inventors: Jingwen Lu, Hefei (CN); Hai-Han Hung, Hefei (CN); Meng-Cheng Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 363 days.

(21) Appl. No.: 17/444,669

(22) Filed: Aug. 8, 2021

(65) Prior Publication Data
US 2022/0285204 A1 Sep. 8, 2022

Related U.S. Application Data

(63) Continuation of application No. PCT/CN2021/099856, filed on Jun. 11, 2021.

(30) Foreign Application Priority Data

Aug. 13, 2020 (CN) .......................... 202010811395.9

(51) Int. Cl.
*H01L 21/762* (2006.01)
*H01L 21/3105* (2006.01)
*H01L 21/768* (2006.01)

(52) U.S. Cl.
CPC .. *H01L 21/76224* (2013.01); *H01L 21/31055* (2013.01); *H01L 21/7682* (2013.01); *H01L 21/76831* (2013.01); *H01L 21/76897* (2013.01)

(58) Field of Classification Search
CPC ......... H01L 21/76224; H01L 21/31055; H01L 21/7682; H01L 21/76831; H01L 21/76897; H01L 21/76877; H01L 21/764
See application file for complete search history.

(56) References Cited

U.S. PATENT DOCUMENTS

| | | | |
|---|---|---|---|
| 7,838,928 B2 | 11/2010 | Graf |
| 7,842,574 B2 | 11/2010 | Arena |
| 9,293,362 B2 | 3/2016 | Lee et al. |
| 9,881,924 B2 | 1/2018 | Wang et al. |
| 10,163,909 B2 | 12/2018 | Wang et al. |
| 10,475,893 B2 | 11/2019 | Bian |
| 10,566,332 B2 | 2/2020 | Wang et al. |

(Continued)

FOREIGN PATENT DOCUMENTS

| | | |
|---|---|---|
| CN | 103903994 A | 7/2014 |
| CN | 107369686 A | 11/2017 |

(Continued)

*Primary Examiner* — Thanh Y. Tran
(74) *Attorney, Agent, or Firm* — Syncoda LLC; Feng Ma

(57) ABSTRACT

A method for preparing a semiconductor device includes: providing a semiconductor substrate, in which a trench is formed on the semiconductor substrate, a filling layer is formed in the trench, and a void is formed in the filling layer; removing a portion of the filling layer to expose the void; forming a plug, in which the plug is configured to plug the void and extends into the void by at least a preset distance; and removing a portion of the filling layer and remaining the plug with at least a preset height until the filling layer reaches a preset thickness to form a contact hole.

19 Claims, 25 Drawing Sheets

(56) References Cited

U.S. PATENT DOCUMENTS

| | | | |
|---|---|---|---|
| 2007/0218684 A1* | 9/2007 | Kim | H01L 21/76883 |
| | | | 257/E21.585 |
| 2008/0211015 A1 | 9/2008 | Arena | |
| 2014/0175659 A1 | 6/2014 | Lee et al. | |
| 2016/0086985 A1* | 3/2016 | Chung | H01L 27/14643 |
| | | | 257/443 |
| 2016/0172304 A1 | 6/2016 | Lee et al. | |
| 2017/0330882 A1 | 11/2017 | Wang et al. | |
| 2018/0102366 A1 | 4/2018 | Wang et al. | |
| 2019/0027564 A1 | 1/2019 | Bian | |
| 2019/0088658 A1 | 3/2019 | Wang et al. | |
| 2020/0335336 A1* | 10/2020 | Leobandung | H01L 29/4232 |

FOREIGN PATENT DOCUMENTS

| | | |
|---|---|---|
| CN | 107452787 A | 12/2017 |
| CN | 110970436 A | 4/2020 |
| CN | 111403282 A | 7/2020 |

* cited by examiner

```
┌─────────────────────────────────────────────────────────────┐
│ A semiconductor substrate is provided, in which a trench is │
│ formed on the semiconductor substrate, a filling layer is   │
│ formed in the trench, and a void is formed in the filling   │
│ layer                                                       │
└─────────────────────────────────────────────────────────────┘
                              │
┌─────────────────────────────────────────────────────────────┐
│     A portion of the filling layer is removed to expose     │
│                         the void                            │
└─────────────────────────────────────────────────────────────┘
                              │
┌─────────────────────────────────────────────────────────────┐
│  A plug is formed, in which the plug is configured to plug  │
│  the void and extends into the void by at least a preset    │
│                         distance                            │
└─────────────────────────────────────────────────────────────┘
                              │
┌─────────────────────────────────────────────────────────────┐
│ A portion of the filling layer is removed, and the plug     │
│ with at least a preset height is remained until the filling │
│ layer reaches a preset thickness to form a contact hole     │
└─────────────────────────────────────────────────────────────┘
```

FIG. 25

SEMICONDUCTOR DEVICE AND METHOD FOR PREPARING SEMICONDUCTOR DEVICE

CROSS-REFERENCE TO RELATED APPLICATIONS

This is a continuation application of International Patent Application No. PCT/CN2021/099856 filed on Jun. 11, 2021, which claims priority to Chinese Patent Application No. 202010811395.9 filed on Aug. 13, 2020. The disclosures of these applications are hereby incorporated by reference in their entirety.

BACKGROUND

A wire connection method between a transistor and a capacitor of a Dynamic Random-Access Memory (DRAM) is typically a polycrystalline silicon-metal plug connection method. When the process scales down, the dimension shrinks accordingly, and the performance of connection resistance and the contact surface between polycrystalline silicon and metal is important.

SUMMARY

The present disclosure relates generally to the technical field of semiconductors, and more specifically to a semiconductor device and a method for preparing the semiconductor device.

An embodiment of the present disclosure provides a method for preparing a semiconductor device, so that the formation of a V-shaped silicon oxide surface can be avoided, and the conductivity of the semiconductor device can be improved.

An embodiment of the present disclosure provides a method for preparing a semiconductor device, which includes the following operations. A semiconductor substrate is provided, in which a trench is formed on the semiconductor substrate, a filling layer is formed in the trench, and a void is formed in the filling layer. A portion of the filling layer is removed to expose the void. A plug is formed, in which the plug is configured to plug the void and extends into the void by at least a preset distance. A portion of the filling layer is removed, and the plug with at least a preset height is remained until the filling layer reaches a preset thickness to form a contact hole.

An embodiment of the present disclosure also provides a semiconductor device. The semiconductor device includes: a semiconductor substrate, in which a support layer is formed on the semiconductor substrate, and a trench is formed in the support layer; a filling layer, in which the filling layer fills a portion of the trench, and a thickness a of the filling layer and a depth b of the trench satisfy: ⅓b≤a≤½b; an adhesion layer formed on a surface of the filling layer and arranged in the trench; and a first conductive layer formed on a surface of the adhesion layer and a surface of the support layer, and a second conductive layer formed in the first conductive layer and filling the trench.

An embodiment of the present disclosure also provides a semiconductor device. The semiconductor device includes: a semiconductor substrate, in which a support layer is formed on the semiconductor substrate, and a trench is formed in the support layer; a filling layer, in which the filling layer fills a portion of the trench, and a void is formed in the filling layer; and a plug formed in the trench and at least partially extending into the void.

BRIEF DESCRIPTION OF THE DRAWINGS

FIG. 25 is a flowchart of a method for preparing a semiconductor device according to an embodiment of the present disclosure.

REFERENCE NUMERALS

Figure 1:
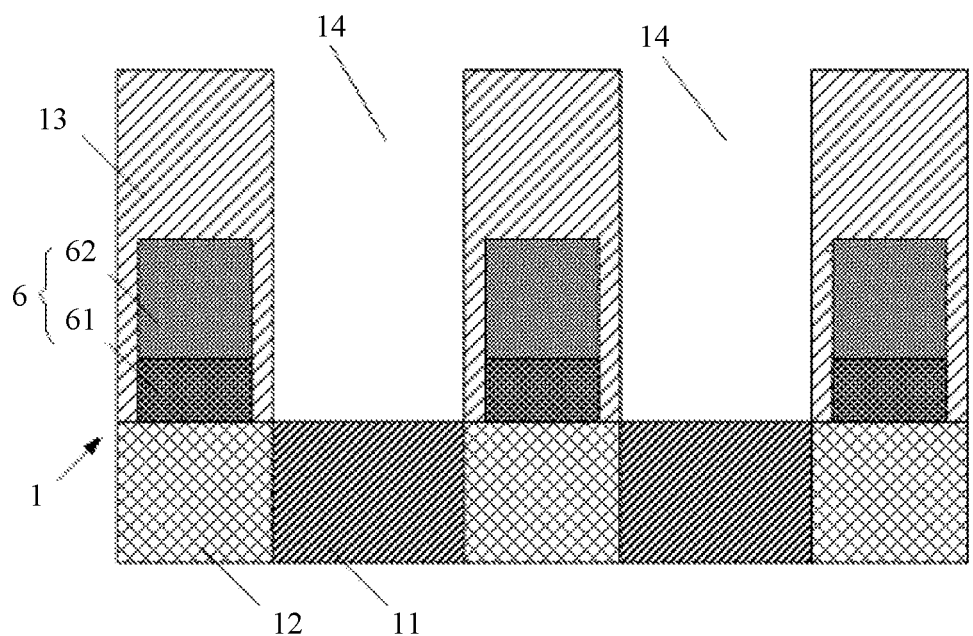
FIG. 1 is a first schematic diagram of a forming process of a method for preparing a semiconductor device according to an embodiment of the present disclosure.

100: semiconductor device; 1: semiconductor substrate; 11: base; 12: silicon oxide layer; 13: support layer; 14: trench; 15: contact hole; 2: filling layer; 21: void; 3: silicon nitride material layer; 31: plug; 4: adhesion layer; 5: wire connection structure; 51: first conductive layer; 52: second conductive layer; 6: bit line structure; 61: first bit line layer; 62: second bit line layer; 7: oxide layer.

DETAILED DESCRIPTION

As the process scales down, the higher the depth-to-width ratio of the bit line, it is more likely that a void is formed in polycrystalline silicon, thereby greatly increasing the resistance value of the wire. In order to eliminate the influence of the void, a deposition-etching-deposition method is usually used to reduce the influence of the void. However, when a polycrystalline silicon layer is etched, the void is etched, and the etching solution and the etching gas enter the void, so that the polycrystalline silicon layer at the void is etched faster, and a V-shaped interface is formed on a surface of a filling layer. The V-shaped interface may form a large-area natural silicon oxide surface, so that the conductivity of the semiconductor device is greatly affected.

A method for preparing a semiconductor device and a semiconductor device according to the embodiments of the present disclosure will be described in detail below in combination with the accompanying drawings.

As shown in FIG. 25, a method for preparing a semiconductor device 100 according to an embodiment of the present disclosure may include the following operations. A semiconductor substrate 1 is provided, in which a trench 14 is formed on the semiconductor substrate 1, a filling layer 2 is formed in the trench 14, and a void 21 is formed in the filling layer 2. A portion of the filling layer 2 is removed to expose the void 21. A plug 31 is formed, in which the plug 31 plugs the void 21 and extends into the void 21 by at least a preset distance. A portion of the filling layer 2 is removed, and the plug 31 with at least a preset height is remained until the filling layer 2 reaches a preset thickness, so as to form a contact hole 15.

As shown in FIG. 1, a semiconductor substrate 1 is provided. The semiconductor substrate 1 may include a base 11, a silicon oxide layer 12 and a support layer 13. The silicon oxide layer 12 is formed in the base 11. The support layer 13 is formed on surfaces of the silicon oxide layer 12 and the base 11. A trench 14 is formed in the support layer 13 by an etching process to expose the base 11, so as to fill the filling layer 2 in the trench 14.

The material of the base 11 may be silicon (Si), germanium (Ge), silicon germanium (GeSi) or silicon carbide (SiC); or may be a Silicon On Insulator (SOI), a Germanium On Insulator (GOI); or may be other materials, e.g. III-V group compounds such as gallium arsenide. The support layer 13 may be a nitride layer, e.g. a silicon nitride layer.

As shown in FIGS. 1-24, the semiconductor substrate 1 may further include a bit line structure 6. The bit line structure 6 is formed on the surface of the silicon oxide layer 12 and arranged in the support layer 13. The support layer 13 includes the bit line structure 6. The bit line structure 6 may include a first bit line layer 61 and a second bit line layer 62, which are stacked on one another. The first bit line layer 61 may be a titanium nitride layer. The second bit line layer 62 may be a metal tungsten layer. The second bit line layer 62 is arranged on a surface of the first bit line layer 61. In other examples of the present disclosure, as shown in FIGS. 13-24, the semiconductor substrate 1 may further include an oxide layer 7. The oxide layer 7 is formed on the surface of the silicon oxide layer 12, arranged in the support layer 13, and formed on both sides of the bit line structure 6. The oxide layer 7 may be a silicon oxide layer. The structure of the semiconductor substrate 1 as shown in FIGS. 13-24 is an N—O—N structure. That is, a protective layer of the bit line structure 6 is configured as a laminated structure of silicon nitride-silicon oxide-silicon nitride.

Figure 2:
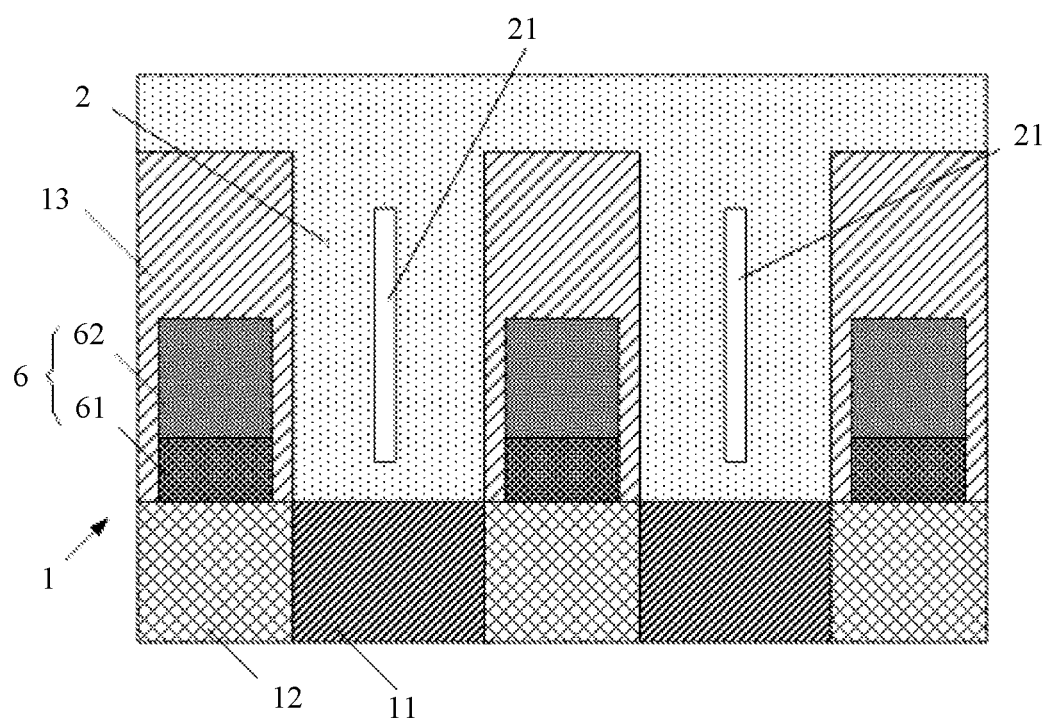
FIG. 2 is a second schematic diagram of a forming process of a method for preparing a semiconductor device according to an embodiment of the present disclosure.
Figure 14:
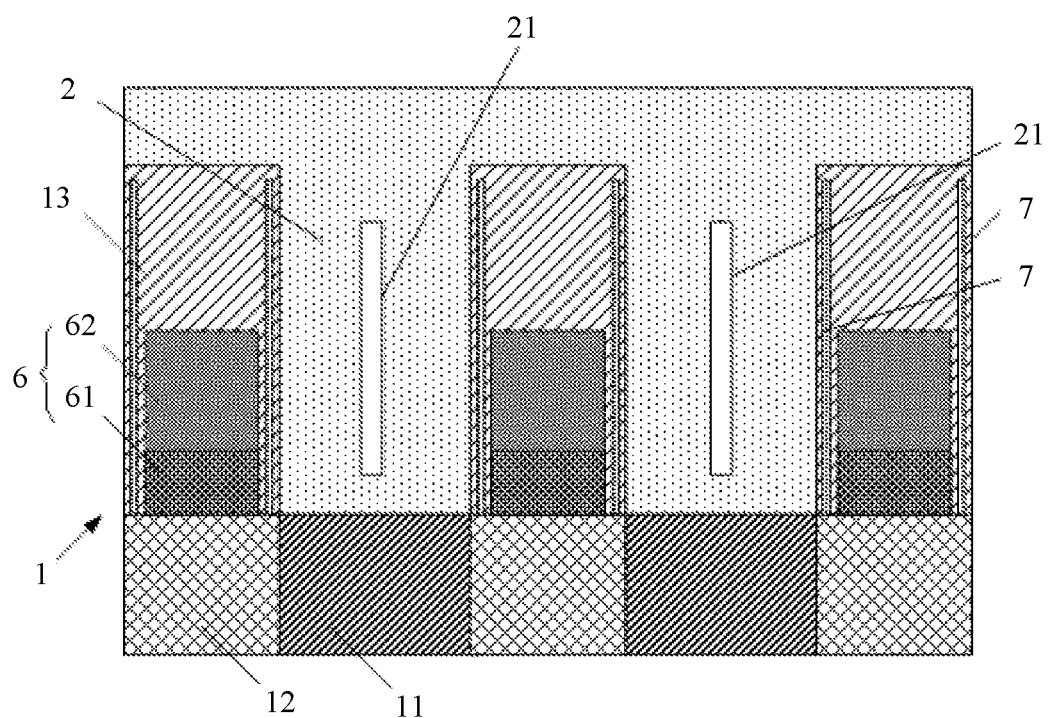
FIG. 14 is a second schematic diagram of a forming process of a method for preparing a semiconductor device according to another embodiment of the present disclosure.

As shown in FIGS. 2 and 14, a filling layer 2 is deposited on the surface of the support layer 13 and in the trench 14. The filling layer 2 fully fills the trench 14. The filling layer 2 may be a polycrystalline silicon layer. As for the forming method of the filling layer 2, the filling layer 2 may be formed through a chemical vapor deposition process or a low pressure chemical vapor deposition process. Alternatively, the filling layer 2 may be formed through other stepwise covering and filling processes. The filling layer 2 may also be doped with arsenic, boron, phosphorus, carbon or other elements, or a mixture thereof. The doping method may be in-situ doping, or adding doping elements by implantation or mixed doping.

Since the trench 14 has a certain depth, a void 21 is easily formed in the filling layer 2 during deposition. The formation of the void 21 greatly increases the resistance value of the wire of the semiconductor device 100. It is therefore necessary to eliminate or reduce the void 21 to reduce the resistance value of the wire of the semiconductor device 100. In some embodiments, before depositing the filling layer 2, a seed layer may be formed firstly, and then the filling layer 2 is deposited. The seed layer is dense and has small grains. In this way, when the filling layer 2 is formed by stepwise covering, the formation of the void 21 is reduced.

Figure 3:
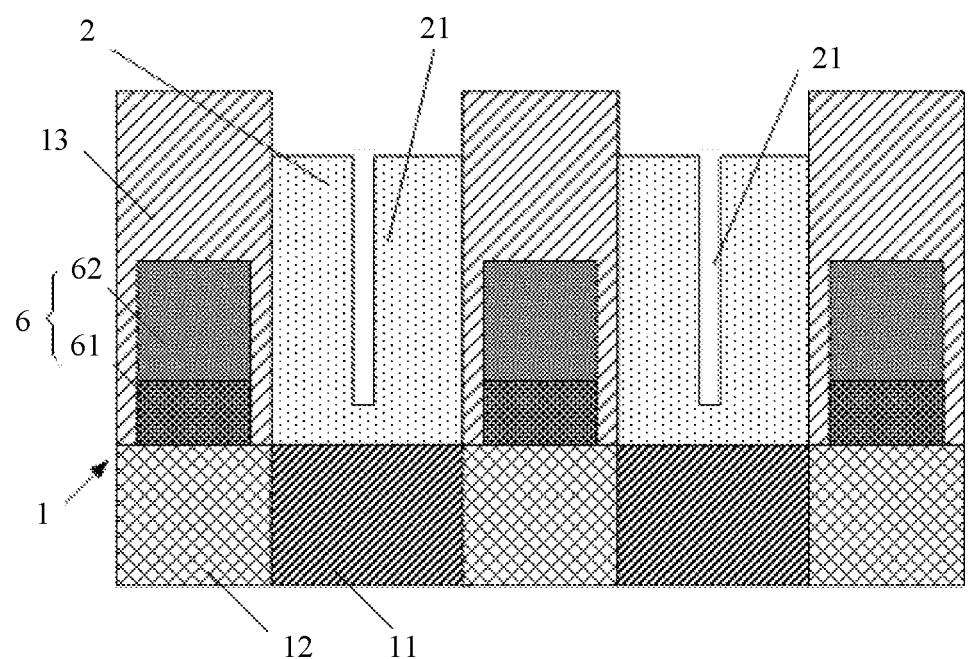
FIG. 3 is a third schematic diagram of a forming process of a method for preparing a semiconductor device according to an embodiment of the present disclosure.
Figure 15:
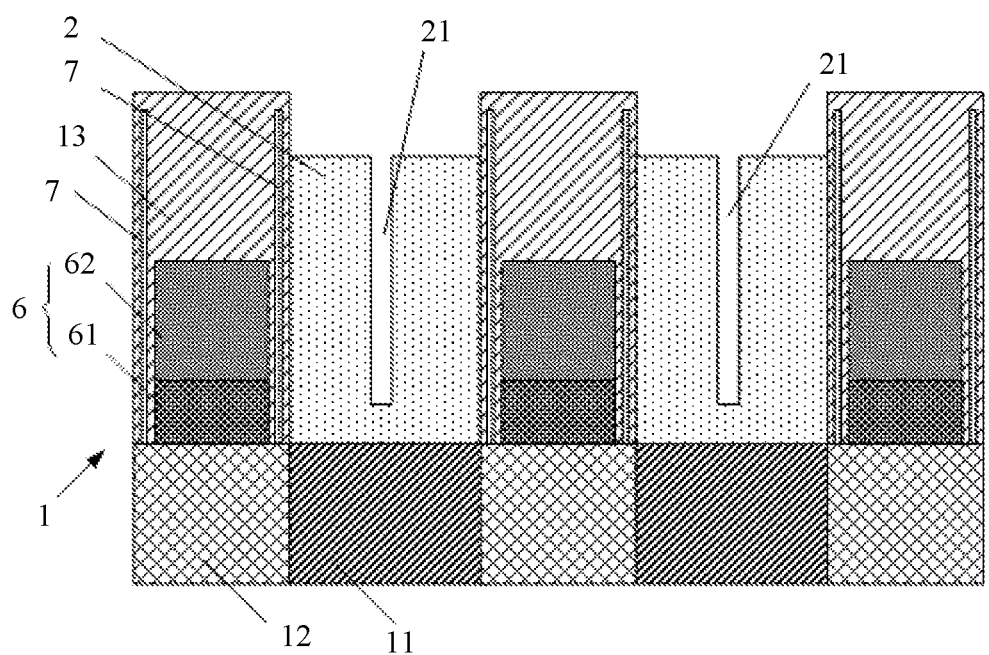
FIG. 15 is a third schematic diagram of a forming process of a method for preparing a semiconductor device according to another embodiment of the present disclosure.

As shown in FIGS. 3 and 15, a portion of the filling layer 2 is removed to expose the void 21. In the actual process, the filling layer 2 may be slightly etched to form a recess, so that the top portion of the filling layer 2 is removed to open the void 21. As for the thickness of the removed filling layer 2, it should meet the requirement that the void 21 can be exposed. As shown in FIGS. 5-6 and 17-18, a plug 31 is formed. The plug 31 plugs the void 21 and extends into the void 21 by at least a preset distance. In this way, the plug 31 is formed, and then the filling layer 2 is etched, so that the etching solution or the etching gas can be avoided from entering the void 21 during the etching process, thereby prevent a V-shaped interface from being formed. The plug 31 may be made of a silicon nitride material.

Figure 4:
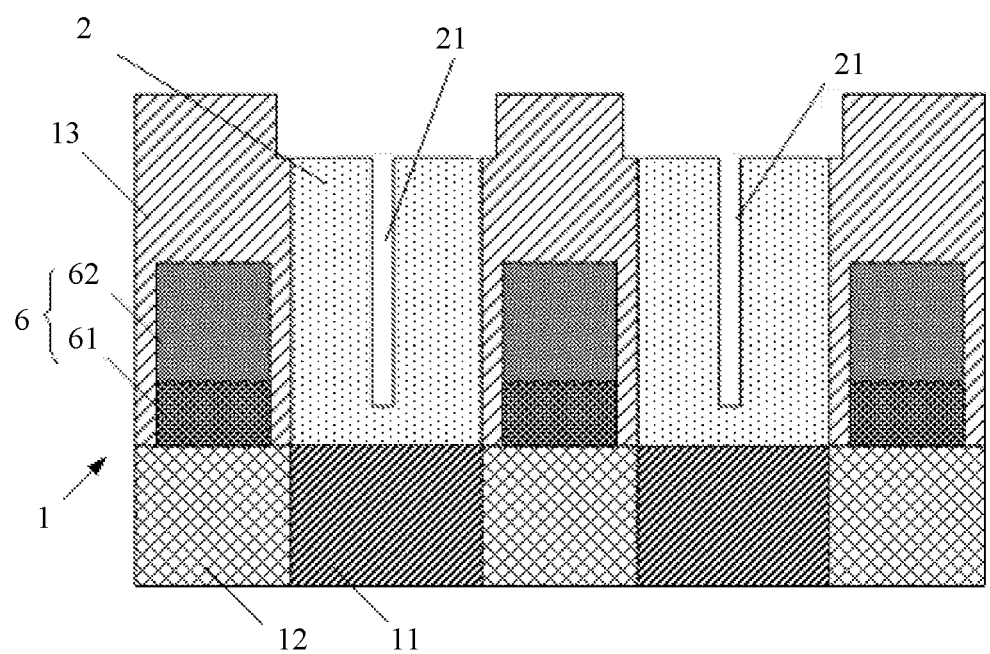
FIG. 4 is a fourth schematic diagram of a forming process of a method for preparing a semiconductor device according to an embodiment of the present disclosure.
Figure 16:
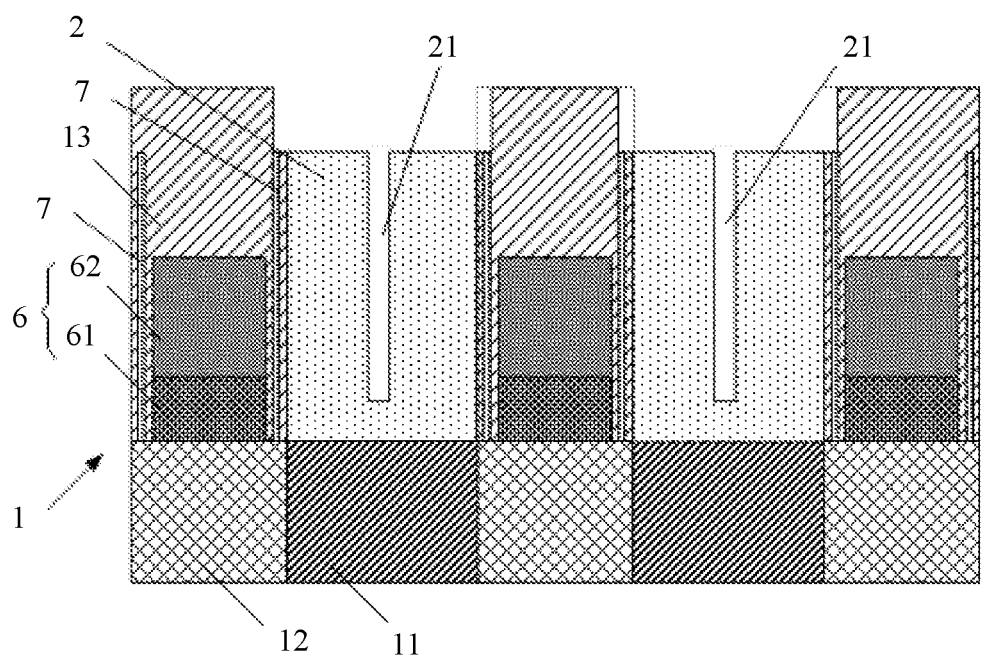
FIG. 16 is a fourth schematic diagram of a forming process of a method for preparing a semiconductor device according to another embodiment of the present disclosure.

As shown in FIGS. 4 and 16, after the portion of the filling layer 2 is removed, a groove is formed on an upper portion of the trench 14. A portion of a side wall of the trench 14 is removed, that is, a portion of a side wall of the support layer 13 corresponding to the groove is removed. The height of the removed portion of the side wall of the support layer 13 corresponds to the height of the removed portion of the filling layer 2. In this way, when the plug 31 is deposited and formed, if the portion of the side wall of the trench 14 is not removed, the deposition material is deposited on the side wall of the trench 14, so that an opening of the upper portion of the trench 14 is easily reduced, and the deposition material on the side wall of the trench 14 covers the filling layer 2 at the bottom of the trench. In this case, when the filling layer 2 is subsequently etched, it is likely that a portion of the filling layer 2 cannot be etched. If the plug 31 is deposited and formed by removing a portion of the side wall of the trench 14, the deposition material is simultaneously deposited and formed on the side wall of the trench 14, so as to fill the removed side wall of the trench 14, while avoiding the filling layer 2 from being covered.

When the portion of the side wall of the trench 14 is removed, wet etching may be adopted. For example, an etching chemical solution, which can etch the support layer 13 and selectively etch the filling layer 2, can be adopted, such as hydrofluoric acid, phosphoric acid, or a mixture thereof. For example, if the material of the support layer 13 is nitride, and the material of the filling layer 2 is polycrystalline silicon, the etching solution for wet etching can etch the nitride. Meanwhile, the etching solution can selectively etch the polycrystalline silicon material, and the etching rate for the polycrystalline silicon material is relatively low.

A method for forming the plug 31 will be described below with reference to FIGS. 5-6 and 17-18. The method for forming the plug 31 may include the following operations. A silicon nitride material layer 3 is formed on a surface of the filling layer 2 and in the void 21. The silicon nitride material layer 3 on the surface of the filling layer 2 is removed. A silicon nitride material in the void 21 is remained to form the plug 31. In this way, the exposed void 21 can be filled by depositing the silicon nitride material, and the plug 31 serves as an etching plug to plug the void 21 during the etching process of the filling layer 2, so that the formation of a V-shaped interface of the filling layer 2 is eliminated, and the performance of the semiconductor device is improved.

Figure 5:
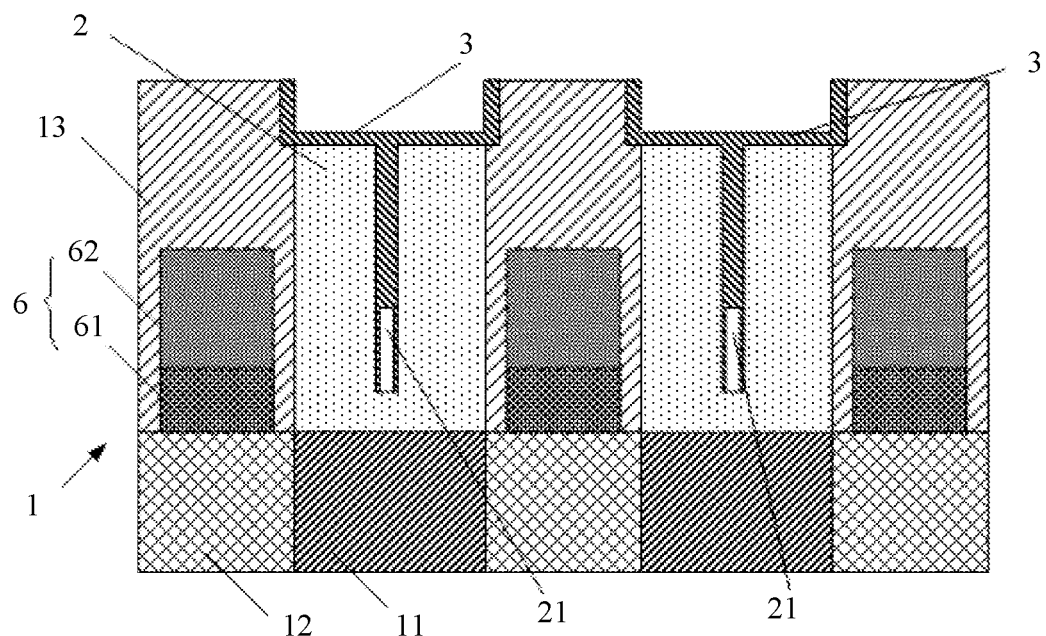
FIG. 5 is a fifth schematic diagram of a forming process of a method for preparing a semiconductor device according to an embodiment of the present disclosure.
Figure 17:
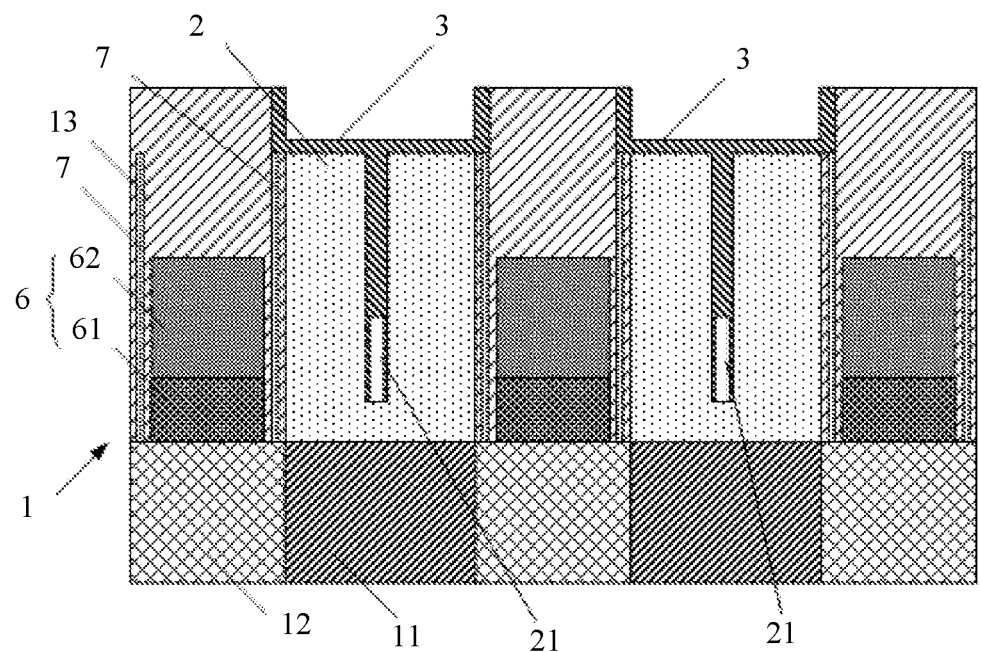
FIG. 17 is a fifth schematic diagram of a forming process of a method for preparing a semiconductor device according to another embodiment of the present disclosure.

As shown in FIGS. 5 and 17, a silicon nitride material layer 3 is deposited on the surface of the filling layer 2 and in the void 21 through a low pressure chemical vapor deposition process or an atomic layer deposition process. The silicon nitride material layer 3 is deposited and formed on an upper surface of the filling layer 2. Since the void 21 is opened and exposed, the silicon nitride material layer 3 can be partially deposited in the void 21. However, since the void 21 is elongated, the silicon nitride material cannot fully fill the whole void 21. Thus, an opening can be formed in an upper portion of the void 21 to plug the void 21.

Figure 6:
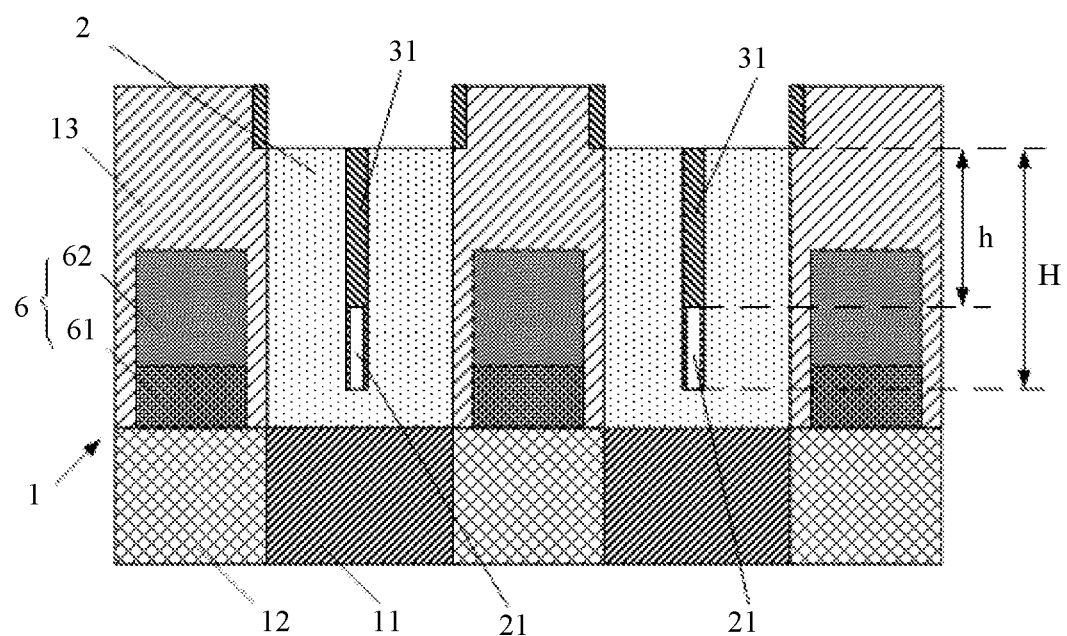
FIG. 6 is a sixth schematic diagram of a forming process of a method for preparing a semiconductor device according to an embodiment of the present disclosure.
Figure 18:
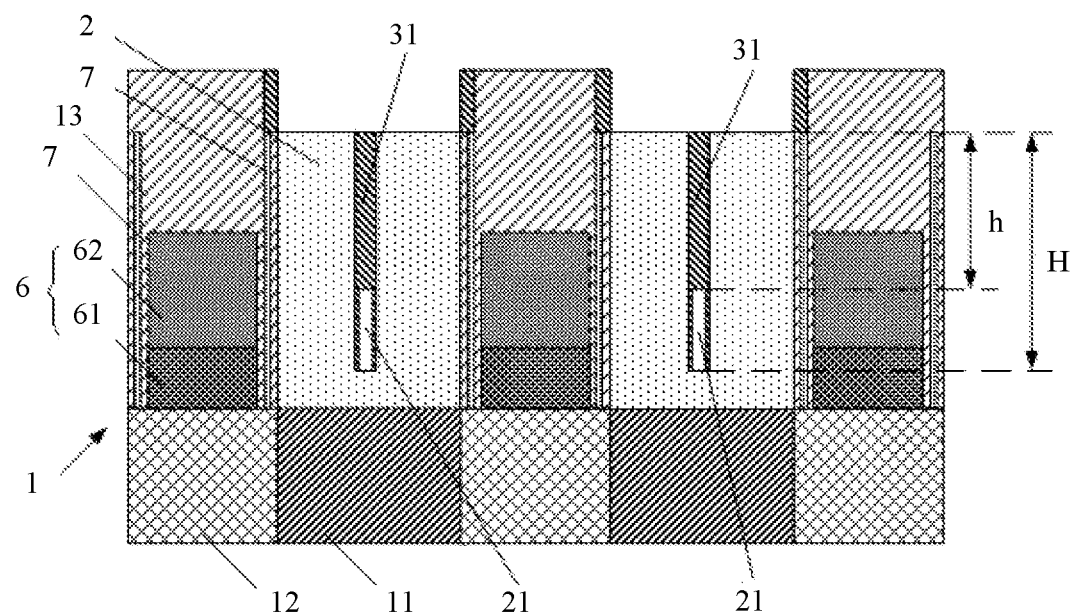
FIG. 18 is a sixth schematic diagram of a forming process of a method for preparing a semiconductor device according to another embodiment of the present disclosure.

As shown in FIGS. 6 and 18, the silicon nitride material layer 3 on the surface of the filling layer 2 is removed, and the silicon nitride material in the void 21 is remained to form the plug 31. A depth h of the plug 31 in the void 21 and a depth H of the void 21 satisfy: $\frac{2}{3}H \leq h \leq \frac{3}{4}H$. That is, a height of the plug 31 in the void 21 is two-thirds to three-quarters of a total height of the void 21.

Figure 7:
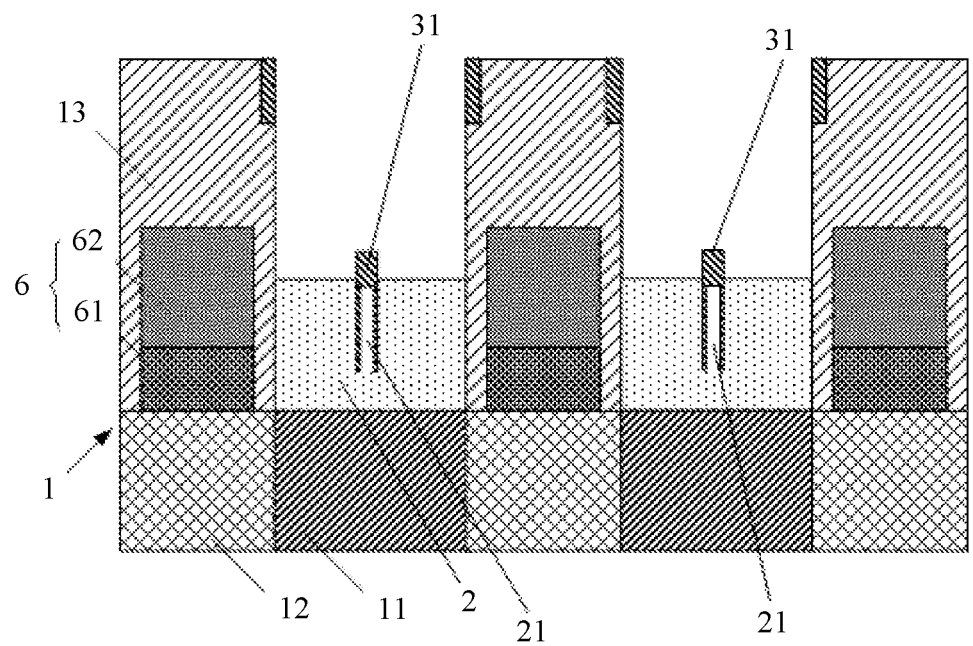
FIG. 7 is a seventh schematic diagram of a forming process of a method for preparing a semiconductor device according to an embodiment of the present disclosure.
Figure 19:
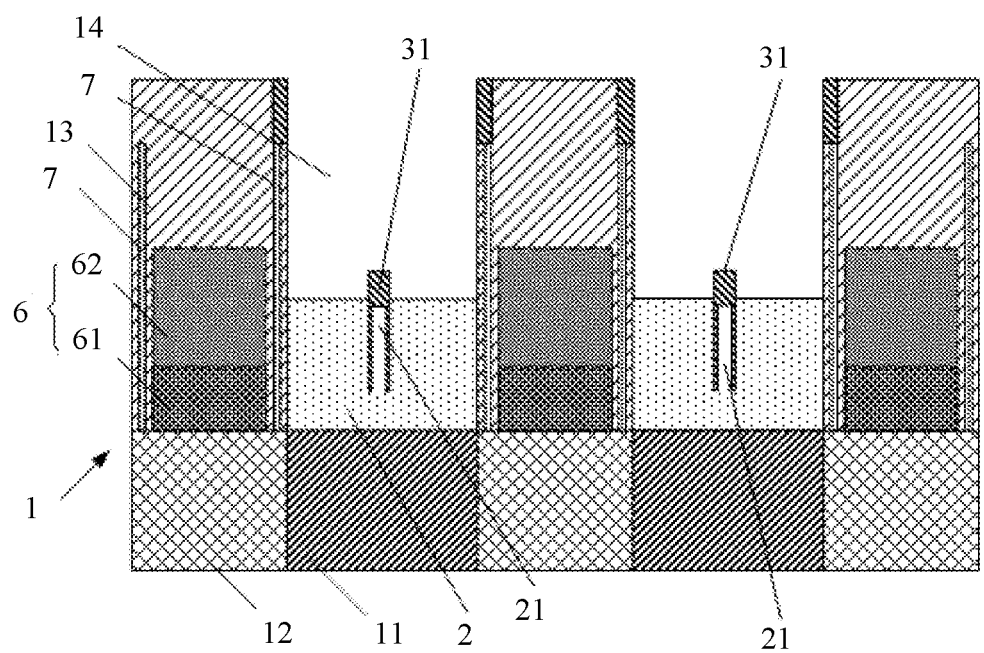
FIG. 19 is a seventh schematic diagram of a forming process of a method for preparing a semiconductor device according to another embodiment of the present disclosure.

As shown in FIGS. 7 and 19, after the plug 31 is formed, the remaining filling layer 2 is etched. At this moment, the plug 31 has plugged the void 21, so that the etching solution or gas can be prevented from entering the void 21 when the filling layer 2 is etched. The filling layer 2 may be removed to a target depth through dry etching or other processes. For example, one or a mixture of sulfur hexafluoride ($SF_6$), carbon tetrafluoride ($CF_4$), chlorine ($Cl_2$), argon (Ar), and other gases can be used for etching. Since the etching rates of the polycrystalline silicon material and the nitride material are different from each other, when the filling layer 2 is etched, the etching rate of nitride is lower than that of polycrystalline silicon. The plug 31 is etched slower relative to the filling layer 2, so that the plug 31 protrudes relative to the upper surface of the filling layer 2. Thus, the void 21 can be always plugged by the plug 31. As for an etching depth of the filling layer 2, the filling layer 2 may be etched until a lower end of the plug 31. That is, the filling layer 2 may be etched until the upper surface of the filling layer 2 is not lower than a lower surface of the plug 31, so that the void 21 is prevented from being exposed due to over-etching of the filling layer 2. In some embodiments, the height of the remaining filling layer 2 may be one-half to two-thirds of the depth of the trench 14, thereby not only facilitating the formation of a wire connection structure 5 on the surface of the filling layer 2, but also minimizing the height of the remaining filling layer 2 to reduce the void 21 therein.

Figure 8:
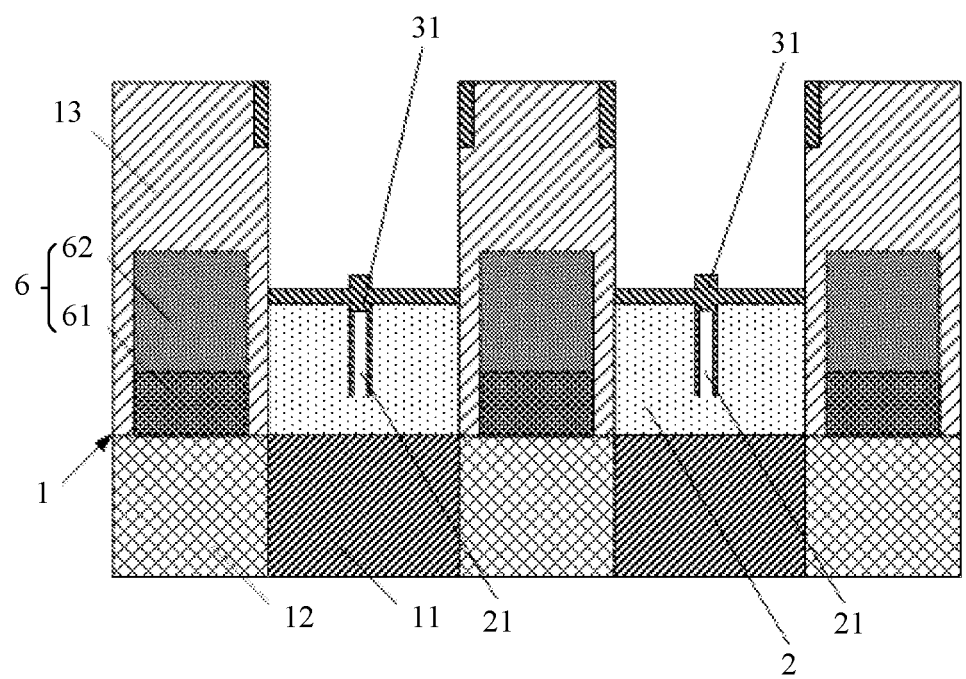
FIG. 8 is an eighth schematic diagram of a forming process of a method for preparing a semiconductor device according to an embodiment of the present disclosure.
Figure 9:
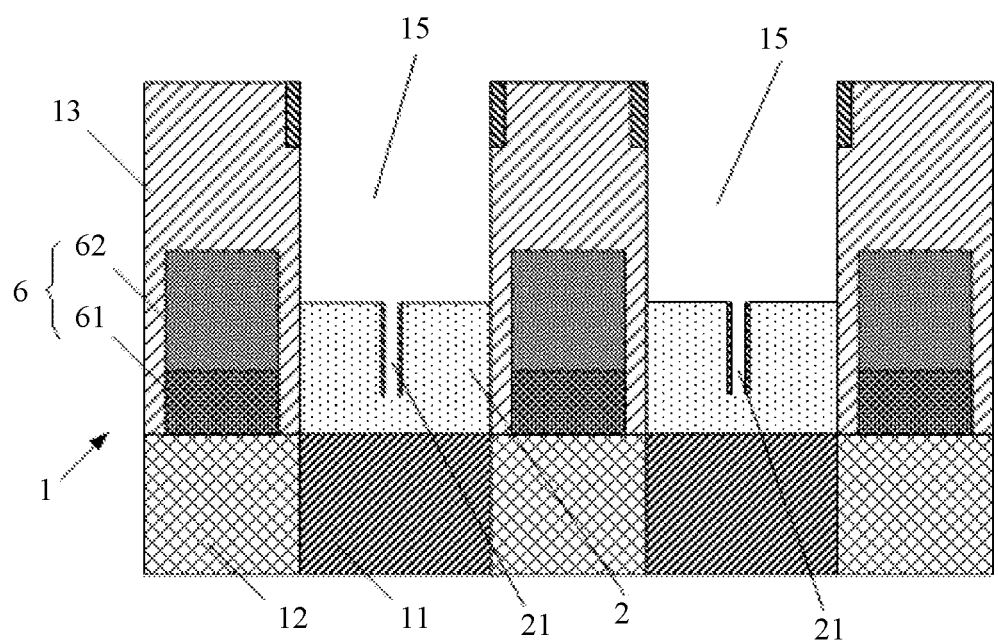
FIG. 9 is a ninth schematic diagram of a forming process of a method for preparing a semiconductor device according to an embodiment of the present disclosure.
Figure 20:
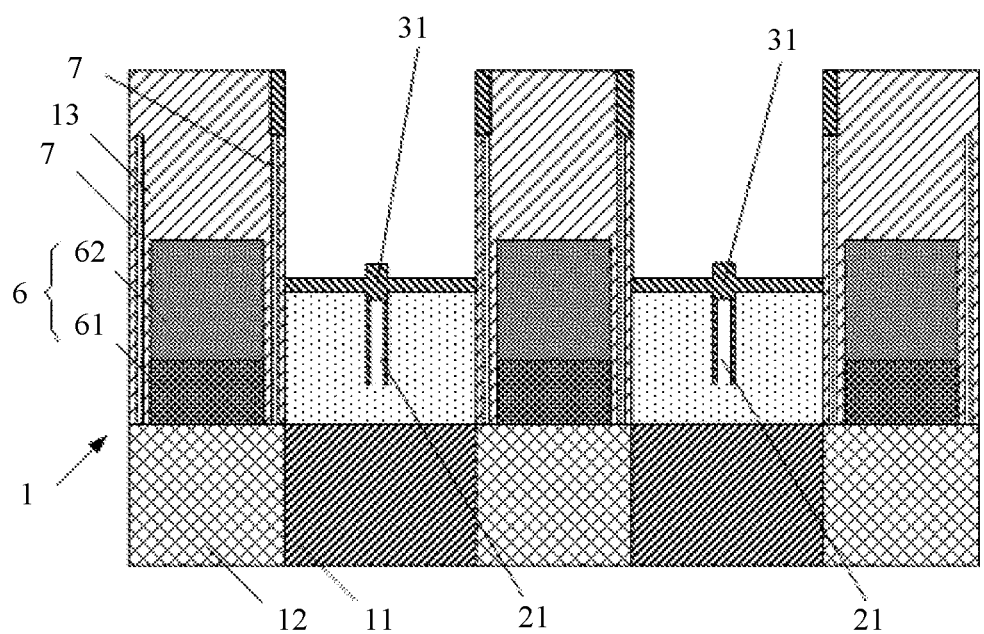
FIG. 20 is an eighth schematic diagram of a forming process of a method for preparing a semiconductor device according to another embodiment of the present disclosure.
Figure 21:
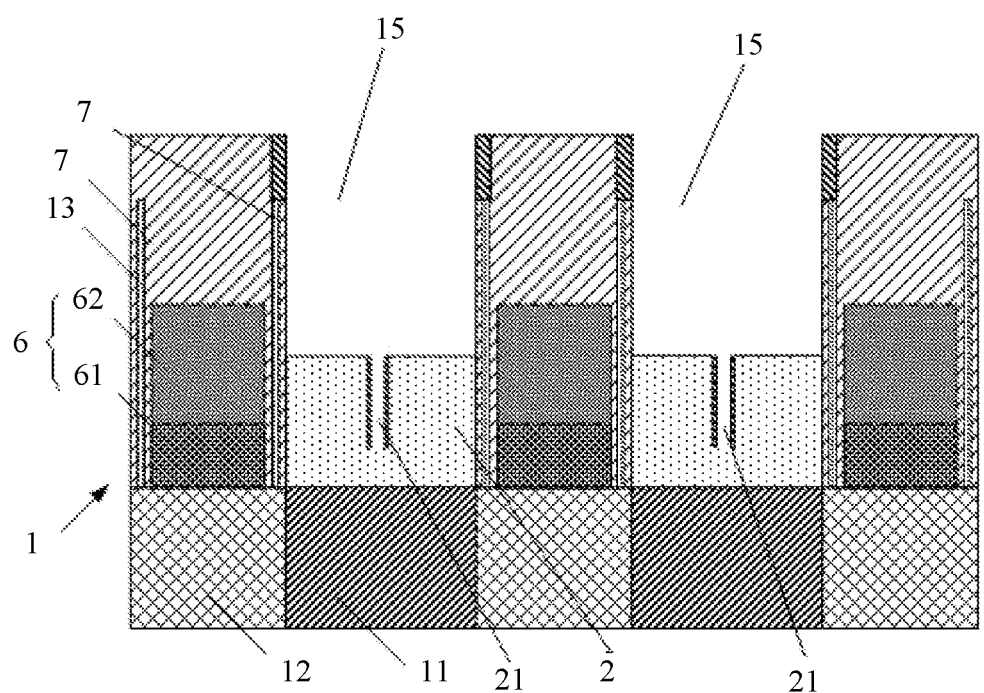
FIG. 21 is a ninth schematic diagram of a forming process of a method for preparing a semiconductor device according to another embodiment of the present disclosure.

As shown in FIGS. 8-9 and FIGS. 20-21, the plug 31 is removed, so as to facilitate the formation of the wire connection structure 5 in the trench 14, and also to prevent the plug 31 from affecting the conductivity of the semiconductor device 100. In some examples of the present disclosure, the plug 31 may be directly etched and removed through an etching process due to its small volume. In other examples of the present disclosure, as shown in FIGS. 8 and 20, a nitride material may be deposited on the surface of the filling layer 2 to cover the upper surface of the filling layer 2. Then the deposited silicon nitride material and the plug 31 are removed by dry etching or wet etching as shown in FIGS. 9 and 21, thereby not only facilitating etching of the plug 31, but also preventing an etching agent from corroding the side wall of the trench 14 during the etching process to protect the side wall of the trench 14.

As shown in FIGS. 10-12 and FIGS. 22-24, a wire connection structure 5 is formed in the contact hole 15. The wire connection structure 5 includes an adhesion layer 4, a first conductive layer 51 and a second conductive layer 52. The adhesion layer 4 is formed on the surface of the filling layer 2. The first conductive layer 51 is formed on a surface of the adhesion layer 4 and the side wall of the trench 14. The second conductive layer 52 is formed in the first conductive layer 51 and fills the contact hole 15. That is, the first conductive layer 51 is formed as a U-shaped structure and arranged around the second conductive layer 52. The adhesion layer 4, the first conductive layer 51 and the second conductive layer 52 fully fill the contact hole 15.

The adhesion layer 4 can adhere to the first conductive layer 51 and the filling layer 2 to improve the structural stability. Moreover, the adhesion layer 4 also has a good conductive effect to reduce the resistance and reactance of the wire connection structure 5. In some embodiments, the material of the adhesion layer 4 may be metal silicide. For example, the material of the adhesion layer 4 may be cobalt silicide or nickel silicide, etc.

A method for forming the wire connection structure 5 will be described below with reference to FIGS. 10-12 and FIGS. 22-24. The method for forming the wire connection structure 5 may include the following operations.

Figure 10:
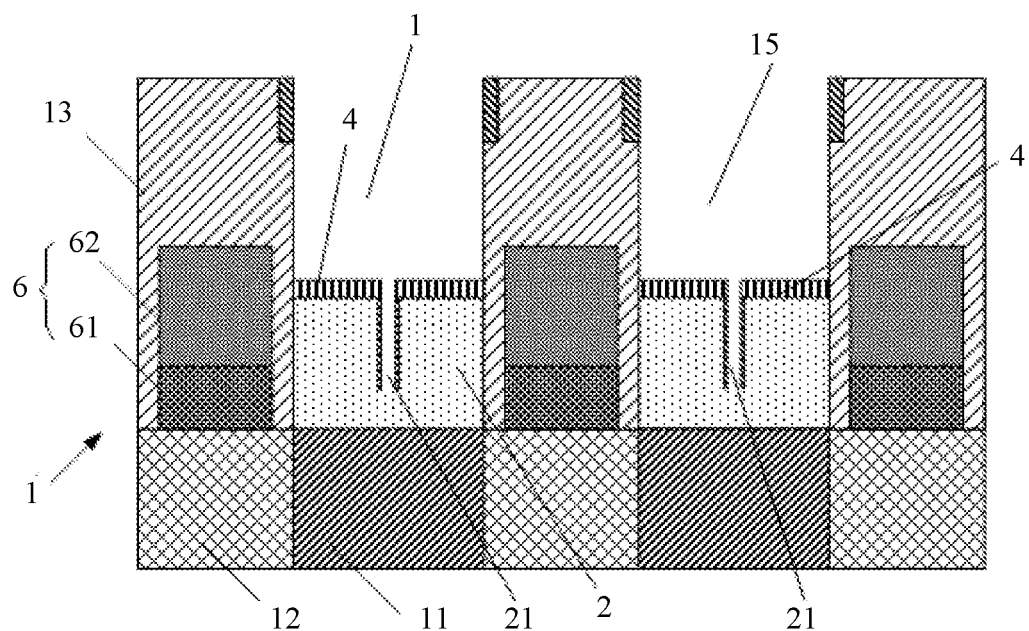
FIG. 10 is a tenth schematic diagram of a forming process of a method for preparing a semiconductor device according to an embodiment of the present disclosure.
Figure 22:
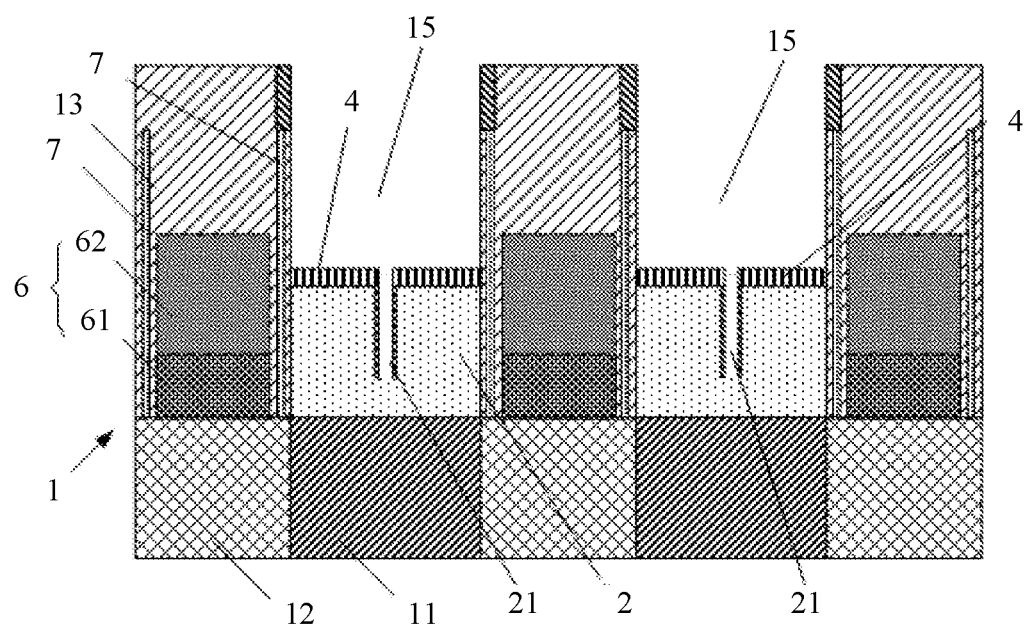
FIG. 22 is a tenth schematic diagram of a forming process of a method for preparing a semiconductor device according to another embodiment of the present disclosure.

As shown in FIGS. 10 and 22, an adhesion layer 4 is formed on the surface of the filling layer 2. For example, metal cobalt or metal nickel may be sputtered on the surface of the filling layer 2. Then the metal cobalt or nickel is promoted to react with the bottom filling layer 2 through a rapid annealing process. Then the unreacted metal cobalt or nickel is removed by an AMP or SPM wet process to form metal silicide on the surface of the filling layer 2.

Figure 11:
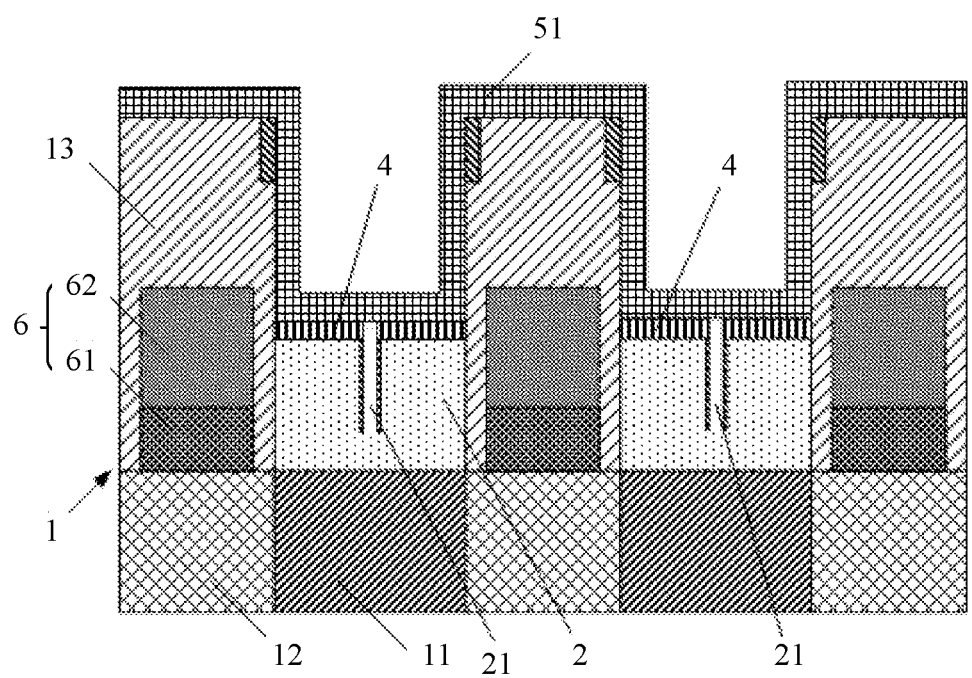
FIG. 11 is an eleventh schematic diagram of a forming process of a method for preparing a semiconductor device according to an embodiment of the present disclosure.
Figure 12:
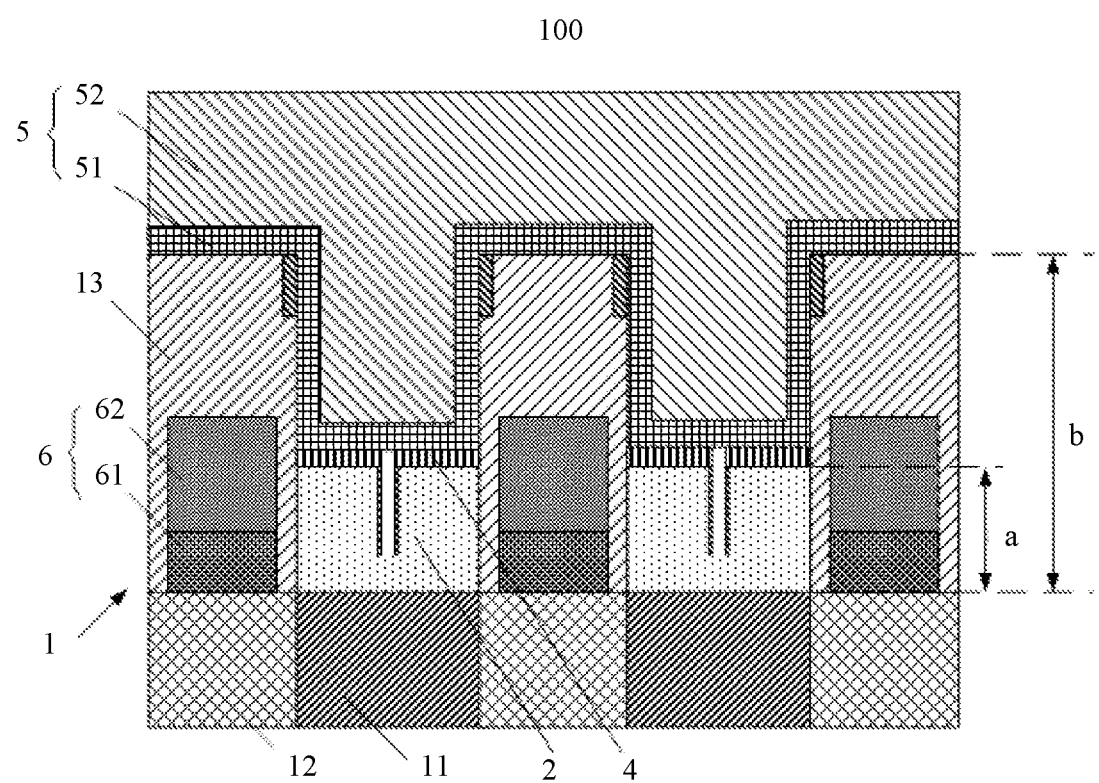
FIG. 12 is a twelfth schematic diagram of a forming process of a method for preparing a semiconductor device according to an embodiment of the present disclosure.
Figure 13:
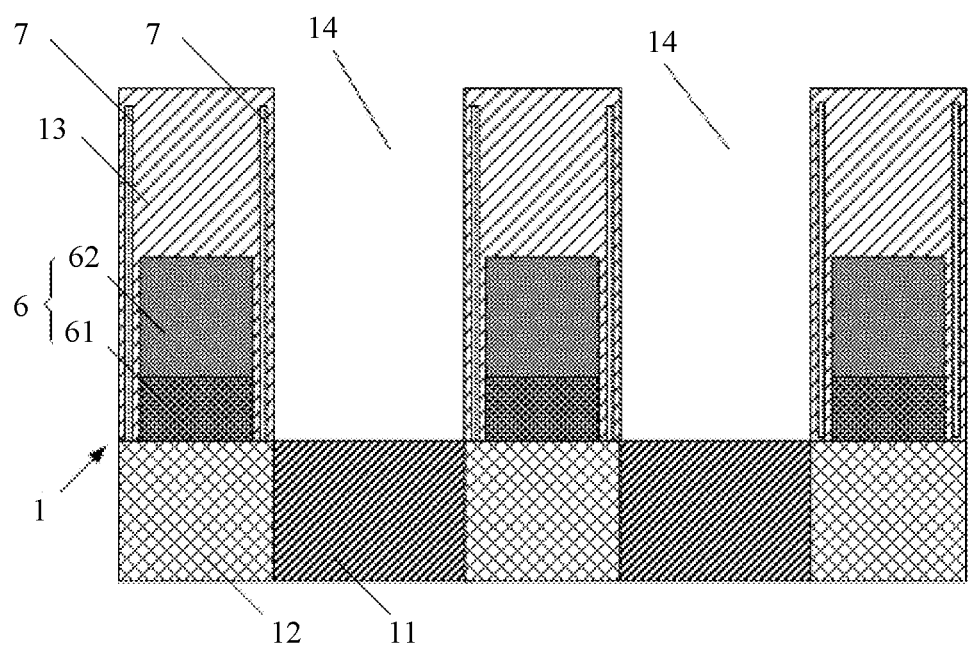
FIG. 13 is a first schematic diagram of a forming process of a method for preparing a semiconductor device according to another embodiment of the present disclosure.
Figure 23:
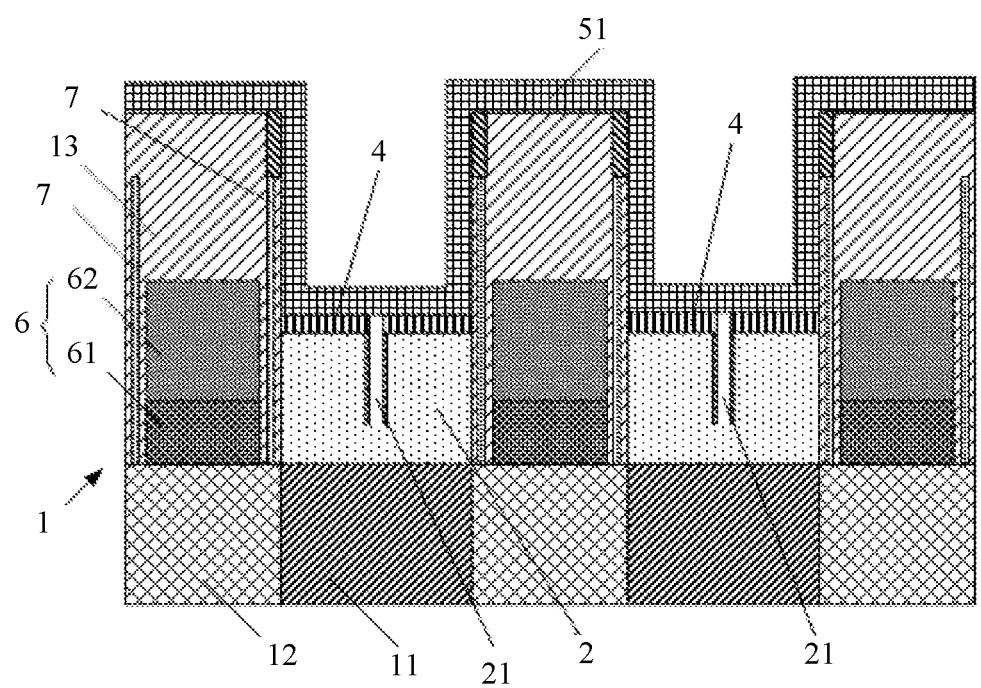
FIG. 23 is an eleventh schematic diagram of a forming process of a method for preparing a semiconductor device according to another embodiment of the present disclosure.
Figure 24:
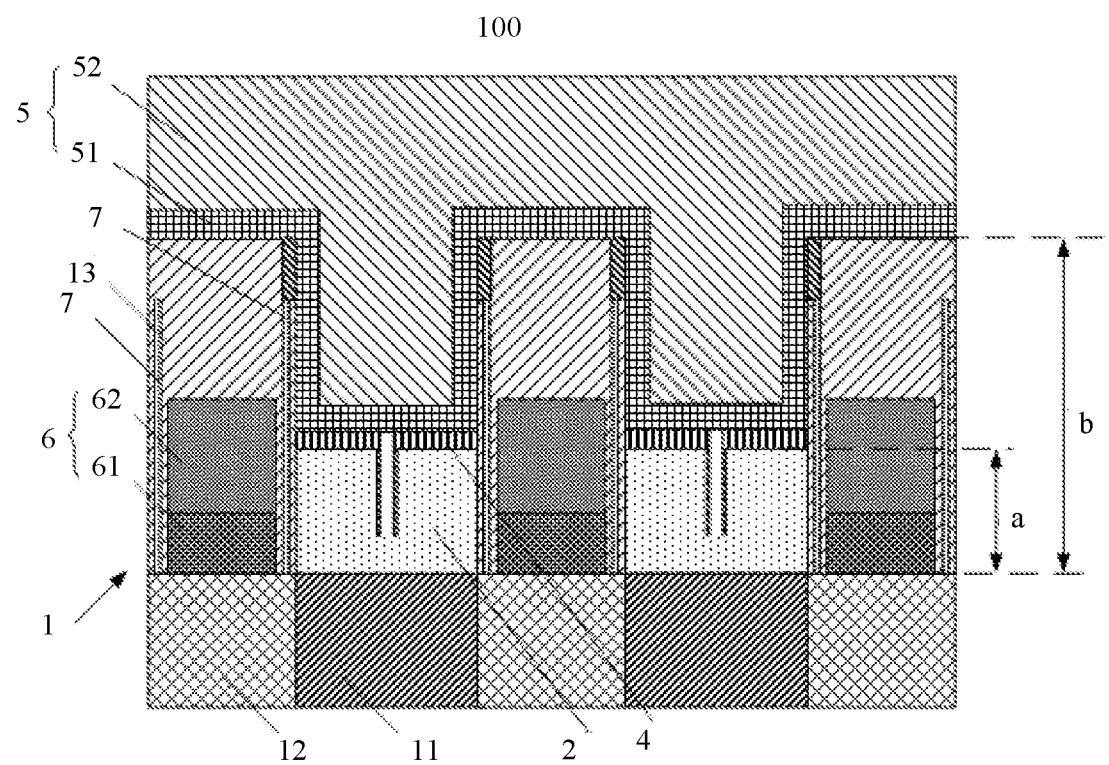
FIG. 24 is a twelfth schematic diagram of a forming process of a method for preparing a semiconductor device according to another embodiment of the present disclosure.

As shown in FIGS. 11 and 23, a first conductive layer 51 is formed on a surface of the adhesion layer 4 and a side surface of the contact hole 15. As shown in FIGS. 12 and 24, a second conductive layer 52 is formed on a surface of the first conductive layer 51 to fill the contact hole 15. The contact hole 15 is formed on the surface of the adhesion layer 4. The first conductive layer 51 covers an upper surface of the support layer 13, the side surface of the contact hole 15, and an upper surface of the adhesion layer 4. The second conductive layer 52 is formed on the surface of the first conductive layer 51 and fully fills the contact hole 15 with the first conductive layer 51 to form a wire connection structure 5. The first conductive layer 51 may be formed as a barrier layer, so that metal diffusion of the second conductive layer 52 can be prevented. In some embodiments, during the formation of the second conductive layer 52, the precursor of the material of the second conductive layer 52 may be chloride, which may be decomposed to generate chloride ions. The diffusion of the chloride ions during the formation of the second conductive layer 52 can also be prevented by the first conductive layer 51. For example, the first conductive layer 51 may be a titanium nitride material, and the second conductive layer 52 may be a metal tungsten layer. During the filling process of metal tungsten, a precursor tungsten hexachloride may be used. The dissociation of tungsten hexachloride will generate chloride ions. The diffusion of the chloride ions can be prevented by the first conductive layer 51.

The semiconductor device according to an embodiment of the present disclosure will be described below with reference to the accompanying drawings.

As shown in FIGS. 12 and 24, the semiconductor device 100 may include a semiconductor substrate 1, a filling layer 2, an adhesion layer 4, a first conductive layer 51 and a second conductive layer 52.

The semiconductor substrate 1 may include a base 11, a silicon oxide layer 12, and a support layer 13 formed on a surface of the silicon oxide layer 12. A trench 14 is formed in the support layer 13 by patterning. The trench 14 exposes a surface of the base 11. The filling layer 2 is formed in the trench 14. The filling layer 2 fills a portion of the trench 14. A thickness a of the filling layer 2 and a depth b of the trench 14 satisfy: ⅓b≤a≤½b. That is, a height of the filling layer 2 may be one-third to one-half of a depth of the trench 14.

The adhesion layer 4 is formed on the surface of the filling layer 2 and arranged in the trench 14. The first conductive layer 51 is formed on the surface of the adhesion layer 4, the side wall of the trench 14, and the surface of the support layer 13. The second conductive layer 52 is formed in the first conductive layer 51 and fills the trench 14. The adhesion layer 4 can adhere to the first conductive layer 51 and the filling layer 2 to improve the structural stability. Moreover, the adhesion layer 4 also has a good conductive effect to reduce the resistance and reactance of the wire connection structure 5. In some embodiments, the material of the adhesion layer 4 may be metal silicide. For example, the material of the adhesion layer 4 may be cobalt silicide or nickel silicide, etc. The material of the support layer 13 may be silicon nitride. The material of the filling layer 2 may be polycrystalline silicon. The material of the first conductive layer 51 may be titanium nitride, and the material of the second conductive layer 52 may be a metal tungsten material.

As shown in FIGS. 12 and 24, the semiconductor device 100 may further include a bit line structure 6. The bit line structure 6 is formed on the surface of the base 11 and arranged in the support layer 13. The bit line structure 6 may include a first bit line layer 61 and a second bit line layer 62, which are stacked on one another. The first bit line layer 61 may be a titanium nitride layer. The second bit line layer 62 may be a metal tungsten layer. The second bit line layer 62 is arranged on a surface of the first bit line layer 61. In some embodiments, as shown in FIG. 24, the semiconductor substrate 1 may further include an oxide layer 7. The oxide layer 7 is formed on the surface of the silicon oxide layer 12, arranged in the support layer 13, and formed on both sides of the bit line structure 6. The oxide layer 7 may be a silicon oxide layer.

As shown in FIGS. 12 and 24, the semiconductor device 100 may further include a silicon nitride film. A void 21 is formed in the filling layer 2. A depth of the void 21 is smaller than a depth of the filling layer 2. The silicon nitride film is formed on an inner wall surface of the void 21, so that etching damage to a side wall of the void 21 formed in the filling layer 2 caused by the etching solution or gas can be reduced when the filling layer 2 is etched.

An embodiment of the present disclosure also provides a semiconductor device 100. As shown in FIGS. 6 and 18, the semiconductor device 100 according to an embodiment of the present disclosure may include a semiconductor substrate 1, a filling layer 2 and a plug 31.

The semiconductor substrate 1 may include a base 11, a silicon oxide layer 12, and a support layer 13 formed on a surface of the silicon oxide layer 12. A trench 14 is formed in the support layer 13 by patterning. The trench 14 exposes a surface of the base 11. The filling layer 2 is formed in the trench 14. The filling layer 2 fills a portion of the trench 14.

The plug 31 is formed in the trench 14 and at least partially extends into a void 21, so that the void 21 can be plugged through the plug 31. When the filling layer 2 is subsequently etched, the etching solution or gas can be prevented from entering the void 21, so that the influence on the performance of the semiconductor device 100 caused by subsequently forming a V-shaped interface on the surface of the filling layer 2 can be avoided.

A depth h of the plug 31 in the void 21 and a depth H of the void 21 satisfy: ⅔H≤h≤¾H. That is, in this case, a height of the plug 31 in the void 21 is two-thirds to three-quarters of a total height of the void 21. Thus, when the plug 31 is deposited, the plug 31 can fill a portion of the void 21, so as to plug an opening of the void 21. When the filling layer 2 is subsequently etched to form a contact hole 15 where a wire connection structure 5 is deposited, it can be ensured that the void 21 is prevented from being exposed to cause the etching solution or gas to enter the void 21 before the filling layer 2 is etched to a target depth, so that the reduction of the performance of the semiconductor device 100 caused by the formation of a V-shaped interface can be avoided.

The embodiments of the present disclosure have the following advantages. The plug is formed in the trench and at least partially extends into the void, so that the void can be plugged through the plug. When the filling layer is subsequently etched, the etching solution or gas can be avoided from entering the void, and the influence on the performance of the semiconductor device caused by subsequently forming the V-shaped interface on the surface of the filling layer can be avoided.

The foregoing descriptions are merely some implementations of the present disclosure. It should be pointed out that a person of ordinary skill in the art may make several improvements and refinements without departing from the principle of the present disclosure, and the improvements and refinements shall fall within the protection scope of the present disclosure.

What is claimed is:

1. A method for preparing a semiconductor device, comprising:
   providing a semiconductor substrate, wherein a trench is formed on the semiconductor substrate, a filling layer is formed in the trench, and a void is formed in the filling layer;
   removing a portion of the filling layer to expose the void;
   forming a plug, wherein the plug is configured to plug the void and extends into the void by at least a preset distance; and
   removing a portion of the filling layer and remaining the plug with at least a preset height until the filling layer reaches a preset thickness to form a contact hole.

2. The method for preparing the semiconductor device of claim 1, wherein the plug is made of a silicon nitride material.

3. The method for preparing the semiconductor device of claim 1, wherein a depth h of the plug extending into the void and a depth H of the void satisfy: $\tfrac{2}{3}H \le h \le \tfrac{3}{4}H$.

4. The method for preparing the semiconductor device of claim 1, wherein forming the plug comprises:
   depositing a silicon nitride material layer on a surface of the filling layer and in the void;
   removing the silicon nitride material layer on the surface of the filling layer; and
   remaining a silicon nitride material in the void to form the plug.

5. The method for preparing the semiconductor device of claim 4, wherein the method, after removing the portion of the filling layer to expose the void and before depositing the silicon nitride material layer on the surface of the filling layer and in the void, further comprises:
   removing a portion of a side wall of the trench.

6. The method for preparing the semiconductor device of claim 4, wherein the silicon nitride material layer is deposited through a low pressure chemical vapor deposition process or an atomic layer deposition process.

7. The method for preparing the semiconductor device of claim 1, wherein the method, after removing the portion of the filling layer and remaining the plug with at least a preset height until the filling layer reaches the preset thickness to form the contact hole, further comprises:
   removing the plug; and
   forming a wire connection structure in the contact hole, wherein the wire connection structure comprises an adhesion layer, a first conductive layer and a second conductive layer.

8. The method for preparing the semiconductor device of claim 7, wherein the adhesion layer is a metal silicide layer.

9. The method for preparing the semiconductor device of claim 8, wherein the adhesion layer is a cobalt silicide layer or a nickel silicide layer.

10. The method for preparing the semiconductor device of claim 7, wherein forming the wire connection structure in the contact hole comprises:
    forming the adhesion layer on a surface of the filling layer;
    forming the first conductive layer on a surface of the adhesion layer and a side surface of the contact hole; and
    forming the second conductive layer on a surface of the first conductive layer to fill the contact hole.

11. The method for preparing the semiconductor device of claim 10, wherein forming the adhesion layer on the surface of the filling layer comprises:
    sputtering a metal material on the surface of the filling layer, and performing a rapid thermal annealing process to form the adhesion layer on the surface of the filling layer.

12. The method for preparing the semiconductor device of claim 10, wherein the first conductive layer is a titanium nitride layer, and the second conductive layer is a metal tungsten layer.

13. The method for preparing the semiconductor device of claim 1, wherein the semiconductor substrate comprises a base and a support layer formed on a surface of the base, and the trench is formed in the support layer.

14. The method for preparing the semiconductor device of claim 1, wherein the filling layer is a polycrystalline silicon layer.

15. A semiconductor device, comprising:
    a semiconductor substrate, wherein a support layer is formed on the semiconductor substrate, and a trench is formed in the support layer;
    a filling layer, wherein the filling layer fills a portion of the trench, and a thickness a of the filling layer and a depth b of the trench satisfy: $\tfrac{1}{3}b$ a $\tfrac{1}{2}b$;
    an adhesion layer formed on a surface of the filling layer and arranged in the trench;
    a first conductive layer formed on a surface of the adhesion layer and a surface of the support layer; and
    a second conductive layer formed in the first conductive layer and filling the trench.

16. The semiconductor device of claim 15, further comprising a silicon nitride film, wherein a void is formed in the filling layer, and the silicon nitride film is formed on an inner wall surface of the void.

17. The semiconductor device of claim 15, further comprising a bit line structure, wherein the bit line structure is formed on a surface of a base and arranged in the support layer.

18. The semiconductor device of claim 17, further comprising an oxide layer, wherein the oxide layer is formed in the support layer and arranged on both sides of the bit line structure.

19. A semiconductor device, comprising:
    a semiconductor substrate, wherein a support layer is formed on the semiconductor substrate, and a trench is formed in the support layer;
    a filling layer, wherein the filling layer fills a portion of the trench, and a void is formed in the filling layer; and
    a plug formed in the trench and at least partially extending into the void,
    wherein a depth h of the plug extending into the void and a depth H of the void satisfy: $\tfrac{2}{3}H \le h \le \tfrac{3}{4}H$.

* * * * *